(12) United States Patent
Wang et al.

(10) Patent No.: US 11,770,908 B2
(45) Date of Patent: Sep. 26, 2023

(54) DISPLAY DEVICE AND A METHOD FOR ASSEMBLING THE DISPLAY DEVICE

(71) Applicant: BOE Technology Group Co., Ltd., Beijing (CN)

(72) Inventors: Wenbin Wang, Beijing (CN); Lei Cao, Beijing (CN); Long Yang, Beijing (CN); Junmin Sun, Beijing (CN); Jinggang Wei, Beijing (CN); Yunpeng Wu, Beijing (CN); Zifeng Wang, Beijing (CN); Yan Ren, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 70 days.

(21) Appl. No.: 17/489,761

(22) Filed: Sep. 29, 2021

(65) Prior Publication Data

US 2022/0174825 A1    Jun. 2, 2022

(30) Foreign Application Priority Data

Nov. 30, 2020  (CN) .......................... 202022838849.X

(51) Int. Cl.
*H05K 5/00*    (2006.01)
*H05K 5/02*    (2006.01)

(52) U.S. Cl.
CPC ......... *H05K 5/0086* (2013.01); *H05K 5/0247* (2013.01)

(58) Field of Classification Search
CPC ...... G06F 1/163; G06F 1/1652; G06F 1/1635; H05K 5/0086; H05K 5/0017; H05K 5/0021; H05K 5/0247; H02J 7/0042
See application file for complete search history.

(56) References Cited

U.S. PATENT DOCUMENTS 7,618,260 B2 *  11/2009  Daniel ................. A44C 5/0007
                                          439/528
9,612,623 B2 *  4/2017  Lim ....................... G06F 1/166

\* cited by examiner

*Primary Examiner* — James Wu
(74) *Attorney, Agent, or Firm* — Ling Wu; Stephen Yang; Ling and Yang Intellectual Property

(57) ABSTRACT

A display device and an assembling method thereof are provided. The display device includes a display including an annular body, two flexible screens and a circuit board assembly disposed on the annular body. The two flexible screens are attached on an outer surface of the annular body, and opposite first ends of the two flexible screens are spliced with each other. The circuit board assembly is disposed in a mounting groove provided on the annular body and positioned between second ends of the two flexible screens. The circuit board assembly is electrically connected to both of the two flexible screens, and can drive the two flexible screens to display independently.

19 Claims, 9 Drawing Sheets

DISPLAY DEVICE AND A METHOD FOR ASSEMBLING THE DISPLAY DEVICE

CROSS-REFERENCE TO RELATED APPLICATION

The present application claims priority of Chinese Patent Application No. 202022838849.X, filed to the CNIPA on Nov. 30, 2020, the content of which is hereby incorporated by reference.

TECHNICAL FIELD

Embodiments of the present application relate to, but are not limited to, the field of display technology, and in particular to a display device.

BACKGROUND

With the rapid development of consumer electronic products, such as foldable mobile phones, smart curved TV and curved computer monitors, etc., display screens are undergoing rapid evolution and iteration of "spherical screens-flat screens-flexible screens". With the development and maturity of flexible screen technology, it is increasingly applied in many products to realize display of some curved surfaces or folded surfaces, so as to achieve more diversified display modes and meet more display requirements.

SUMMARY

The following is a summary of the subject matters detailed herein. The summary is not intended to limit the scope of protection of the claims. An embodiment of the disclosure provides a display device including a display, wherein the display includes an annular body, two flexible screens and a circuit board assembly disposed on the annular body;

the two flexible screens are attached on an outer surface of the annular body, and opposite first ends of the two flexible screens are spliced with each other;

the circuit board assembly is disposed in a mounting groove provided on the annular body and positioned between second ends of the two flexible screens; and the circuit board assembly is electrically connected to both of the two flexible screens and is capable of driving the two flexible screens to display independently.

In an exemplary embodiment, the annular body is further provided with a positioning mark, and the positioning mark is configured to play a role of alignment when the two flexible screens are fixed on the annular body.

In an exemplary embodiment, the positioning mark is a positioning groove or a marking line.

In an exemplary embodiment, the annular body is further provided with a fixation groove located at a side of the mounting groove;

the display further includes a battery disposed in the fixation groove, and the battery is electrically connected to the circuit board assembly.

In an exemplary embodiment, the display is provided with a charging port;

the display device further includes a charging base, wherein the charging base is provided with a power port and a charging connector; the power port is configured to be connected to an external power source; and the charging connector is configured to be connected to the charging port when the display is placed on the charging base.

In an exemplary embodiment, the display further includes a bottom cover bracket disposed on the annular body and covering the mounting groove, a charging motherboard and a bottom cover disposed on the bottom cover bracket;

the circuit board assembly and the battery are electrically connected to the charging motherboard, the charging motherboard is provided with the charging port, and the bottom cover is disposed on an outer side of the charging motherboard and exposes the charging port.

In an exemplary embodiment, the bottom cover bracket is provided with a fixation arm, and the fixation arm is pressed against the battery.

In an exemplary embodiment, the circuit board assembly includes a bottom plate and a core board disposed on the bottom plate and electrically connected to the bottom plate;

the two flexible screens and the charging motherboard are all electrically connected to the bottom plate.

In an exemplary embodiment, when the charging base is connected to an eternal power source to charge the display, the battery is charged through the charging motherboard to supply power to the bottom plate through the charging motherboard after the battery is fully charged;

when the charging base is separated from the display, the battery supplies power to the bottom plate, and the bottom plate supplies power to the two flexible screens and the core board.

In an exemplary embodiment, the charging base includes a base housing and a charging common board disposed in the base housing, wherein the charging common board is provided with the power port and the charging connector, and the charging connector extends out of the base housing and is configured to be inserted and matched with the charging port.

In an exemplary embodiment, the base housing includes a bottom housing and an upper cover, an inner side of the upper cover is provided with a first magnet, and an inner side of the bottom cover is provided with a second magnet having a position corresponding to that of the first magnet and attracting each other.

In an exemplary embodiment, an outer side of the upper cover is provided with a flexible grommet, and the flexible grommet is disposed around the charging connector.

In an exemplary embodiment, a display lamp is disposed on a side of the charging common board facing away from the upper cover.

In an exemplary embodiment, a gap is formed between an edge of the charging common board and a side edge of the bottom housing, and a light guide post is disposed at the gap.

In an exemplary embodiment, the display further includes a screen cover disposed on the annular body and covering outer sides of the two flexible screens, and two ends of the screen cover are respectively positioned at two sides of the bottom cover.

In an exemplary embodiment, portions of the screen cover corresponding to display regions of the two flexible screens are transparent.

In an exemplary embodiment, the display further includes a functional module disposed on an inner side of the screen cover and electrically connected to the circuit board assembly.

In an exemplary embodiment, the functional module includes one or more of a touch button, a WIFI antenna, and an environmental sensor.

In an exemplary embodiment, the core board is provided with a heat conducting member which is in contact with the bottom cover bracket, and the bottom cover bracket is made of a metal material.

An embodiment of the present disclosure further provides a method for assembling a display device, which is applied to any of the foregoing display device, and the assembly method includes:

attaching the two flexible screens on an outer surface of the annular body, and splicing the opposite first ends of the two flexible screens with each other;

disposing the circuit board assembly in the mounting groove provided on the annular body and positioned between the second ends of the two flexible screens; and electrically connecting the circuit board assembly to the two flexible screens to drive the two flexible screens to display independently.

Other aspects may be understood upon reading and understanding of the drawings and the detailed description.

BRIEF DESCRIPTION OF DRAWINGS

The drawings are used to provide a further understanding of technical solutions of the present disclosure and constitute a part of the description, which are used together with the embodiments of the present disclosure to explain the technical solutions of the present disclosure and do not constitute limitations on the technical solutions of the present disclosure.

DETAILED DESCRIPTION

The technical solutions of the disclosure will be further described below in combination with the drawings through specific embodiments. It is to be understood that specific embodiments described here are used to explain the disclosure only, rather than limiting the disclosure. In the case of no conflict, the embodiments in the present disclosure and the features in the embodiments may be randomly combined with each other.

Figure 1:
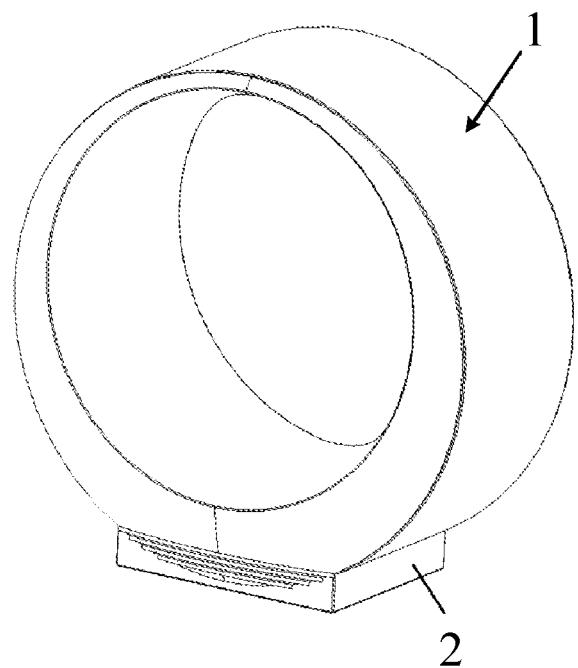
FIG. 1 is a schematic diagram of a structure of a display device according to an embodiment of the present disclosure.
Figure 12:
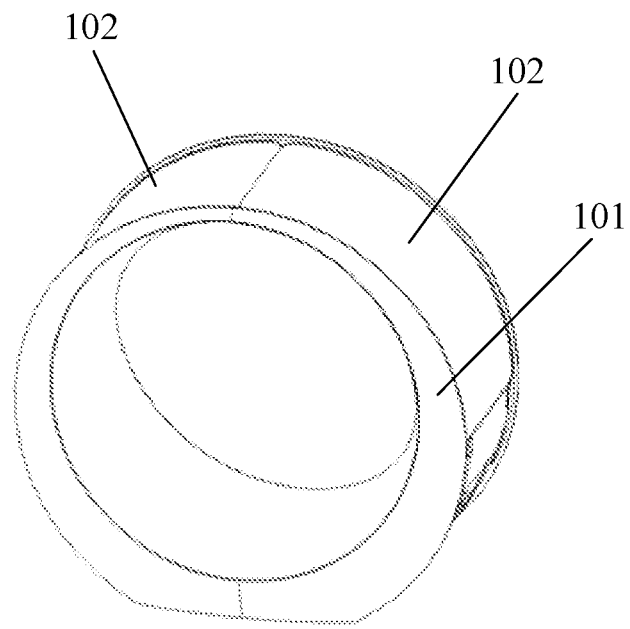
FIG. 12 is a schematic diagram of a structure after the annular body and the two flexible screens of the display of FIG. 11 are assembled.
Figure 13:
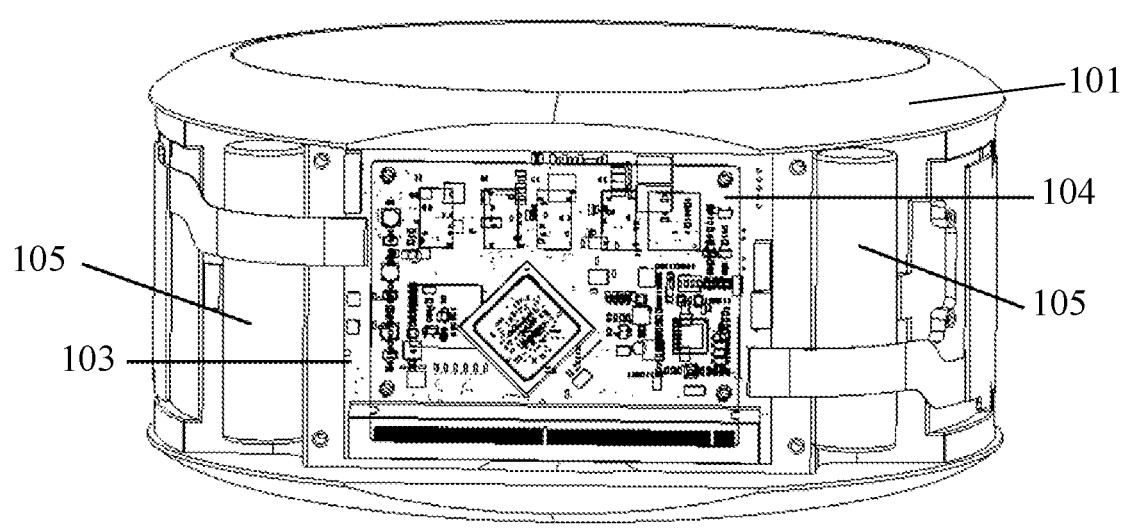
FIG. 13 is a schematic diagram of a structure of the display of FIG. 2 after a bottom plate, a core board and a battery are assembled on the annular body.

An embodiment of the present disclosure provides a display device. In some examples, as shown in FIG. 1, FIG. 12, and FIG. 13, the display device includes a display 1 including an annular body 101, two flexible screens 102 and a circuit board assembly which are disposed on the annular body 101 (in some examples, the circuit board assembly includes a bottom plate 103 and a core board 104 disposed on the bottom plate 103). The two flexible screens 102 are attached to an outer surface of the annular body 101, and opposite first ends of the two flexible screens 102 are spliced with each other. The circuit board assembly is disposed in a mounting groove provided on the annular body 101 and positioned between second ends of the two flexible screens 102. The circuit board assembly is electrically connected to the two flexible screens 102, and can drive the two flexible screens 102 to display independently.

In the display device of the embodiment of the present disclosure, the two flexible screens 102 are disposed on the outer surface of the annular body 101, the opposite first ends of the two flexible screens 102 are spliced with each other, and the circuit board assembly capable of driving the two flexible screens 102 to display independently is disposed on the annular body 101, so that the two flexible screens 102 spliced with each other display in a curved surface shape, and the two flexible screens 102 may display different pictures respectively, or present combined pictures by splicing so as to achieve an effect of splicing display with a curved surface.

Figure 2:
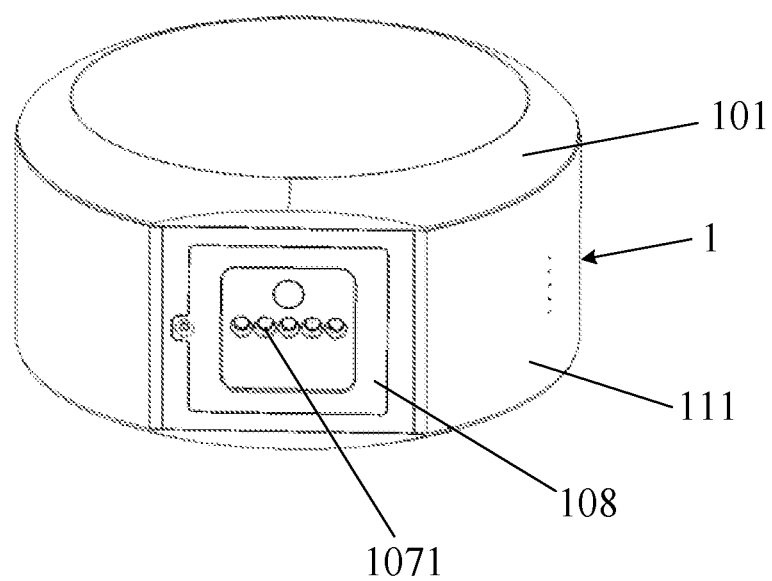
FIG. 2 is a schematic diagram of a structure of a display of a display device.
Figure 3:
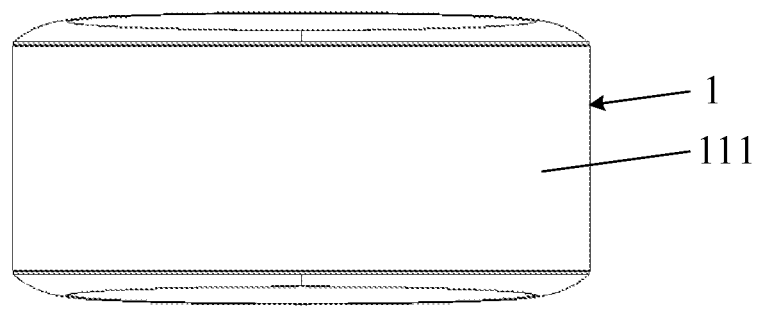
FIG. 3 is a schematic top view of the structure of the display of FIG. 2.
Figure 4:
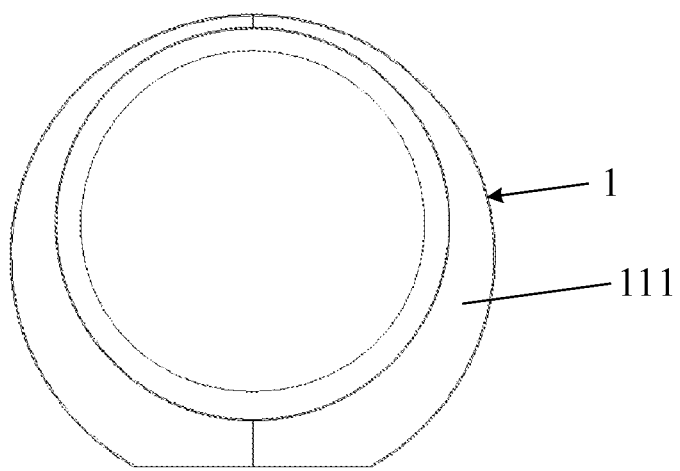
FIG. 4 is a schematic front view of the structure of the display of FIG. 2.
Figure 5:
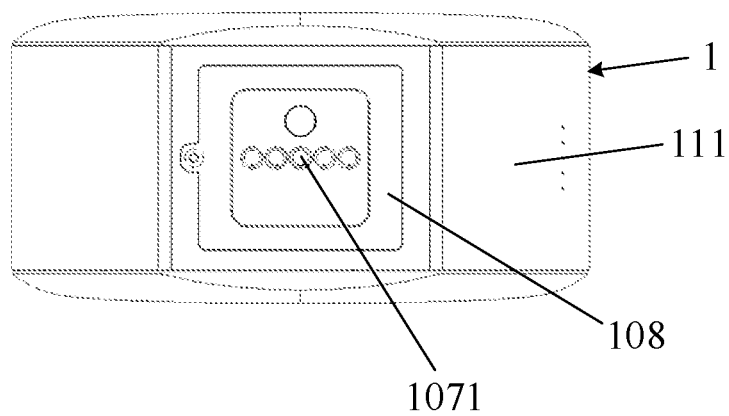
FIG. 5 is a schematic bottom view of the structure of the display of FIG. 2.
Figure 6:
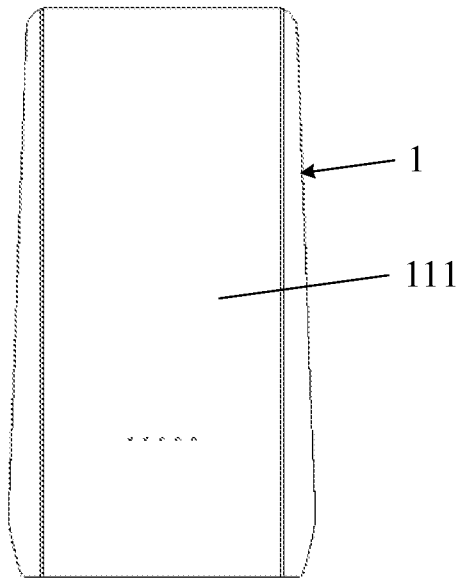
FIG. 6 is a schematic left view of the structure of the display of FIG. 2.
Figure 7:
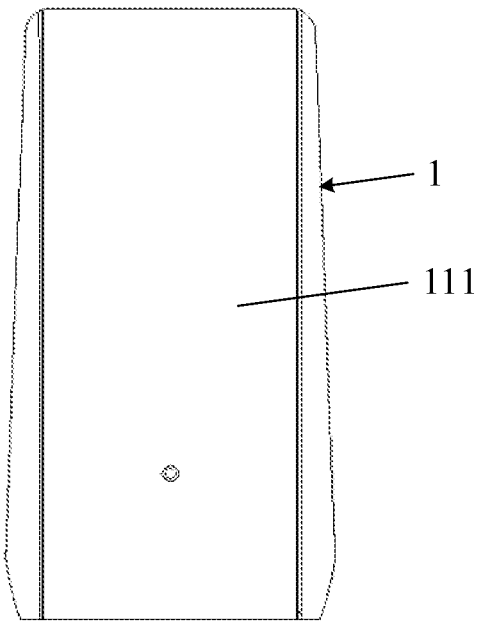
FIG. 7 is a schematic right view of the structure of FIG. 2.
Figure 8:
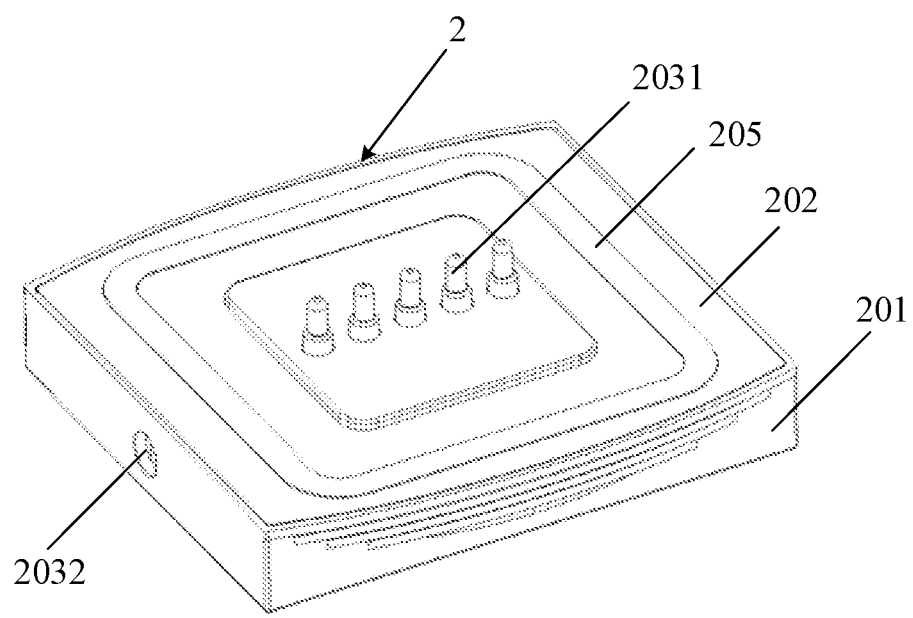
FIG. 8 is a schematic diagram of a structure of a charging base of the display device of FIG. 1.

In some exemplary embodiments, as shown in FIG. 1, FIG. 2 and FIG. 8, the display 1 is provided with a charging port 1071, and the display device further includes a charging base 2, wherein the charging base 2 is provided with a power port 2032 and a charging connector 2031. The power port 2032 is configured to be connected to an external power source, and the charging connector 2031 is configured to be connected to the charging port 1071 when the display 1 is placed on the charging base 2. In this example, the power port 2032 may be connected to a power plug 208, and connected to the external power source through the power plug 208.

In some exemplary embodiments, as shown in FIG. 13, the circuit board assembly includes a bottom plate 103 and a core board 104 disposed on and electrically connected to the bottom plate 103. In an example of this embodiment, the bottom plate 103 is fixed in the mounting groove provided on the annular body 101, and the core board 104 may be inserted into a slot disposed on the bottom plate 103 to be fixed on and electrically connected to the bottom plate 103. The bottom plate 103 is provided thereon with multiple external interfaces, which may be respectively connected to different functional modules, such as a touch button 112, a WIFI antenna, environmental sensors, etc. Among them, the touch button 112 may be a touch screen off button, which may make the flexible screen 102 enter a black screen state after being touched. The WIFI antenna enables the display 1 to communicate with external communication devices. The environmental sensors may include a temperature and humidity sensor, a gas sensor and a light sensor. The temperature and humidity sensor may be used to measure temperature and humidity of air, the gas sensor may be used to measure concentration of a certain gas component in air, and the light sensor may be used to detect brightness of light. The temperature and humidity sensor, the gas sensor and the light sensor may be made on one sensor board 113 (shown in FIG. 9). The two flexible screens 102 may be electrically connected to the bottom plate 103.

Figure 10:
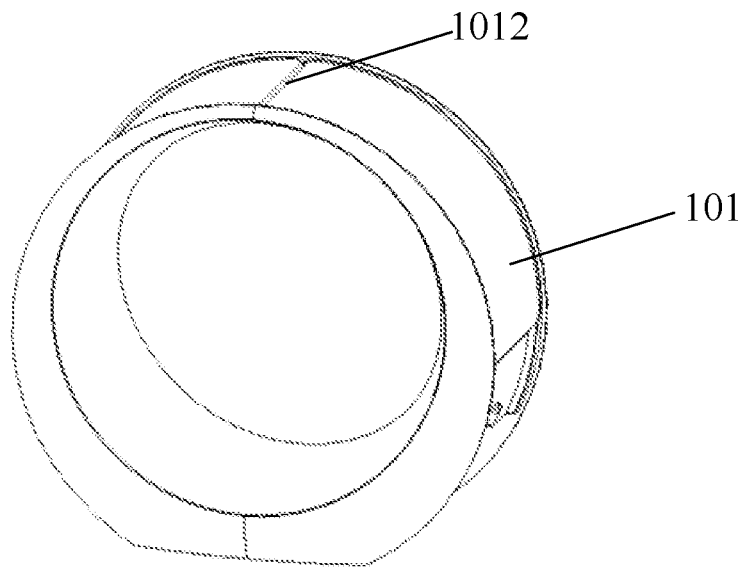
FIG. 10 is a schematic diagram of a structure of an annular body of the display of FIG. 2.
Figure 11:
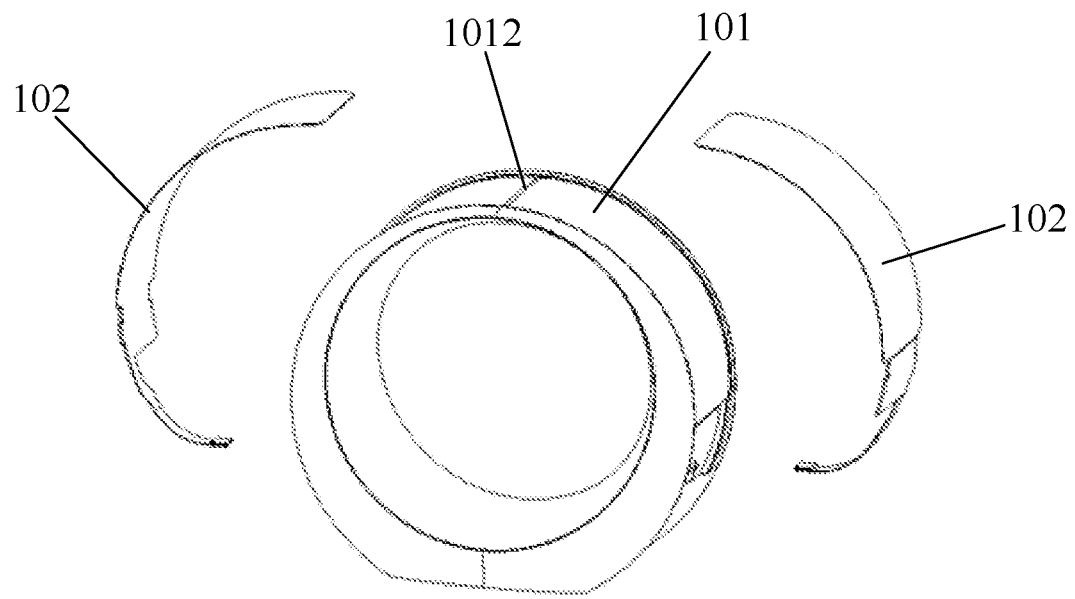
FIG. 11 is a schematic diagram of a structure when the annular body and two flexible screens of the display of FIG. 2 are not assembled.

In some exemplary embodiments, as shown in FIG. 10 and FIG. 11, the annular body 101 may further be provided with a positioning mark, which is used to align the two flexible screens 102 when they are fixed on the annular body 101, so as to prevent the two flexible screens 102 from being deflected and facilitate positioning. The positioning mark may be a positioning groove 1012 or a marking line. The two flexible screens 102 may each be bonded and fixed on the annular body 101 by a double-sided tape or an adhesive. Back sides of the two flexible screens 102 (sides facing away from the display side) may also be attached with a heat dissipation film (SCF) to dissipate heat for the flexible screens 102.

Figure 14:
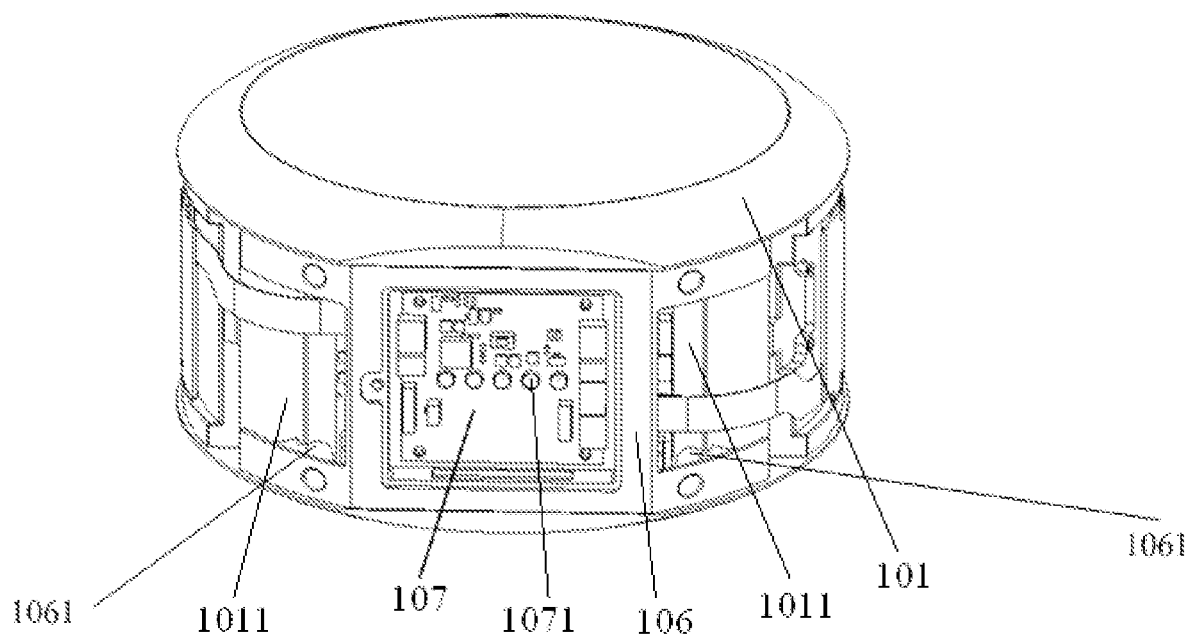
FIG. 14 is a schematic diagram of a structure of the display of FIG. 2 after a bottom cover bracket and a charging motherboard are assembled on the annular body.

In some exemplary embodiments, as shown in FIGS. 13 and 14, the annular body 101 is further provided with a fixation groove 1011 located at a side of the mounting groove, and the display 1 further includes a battery 105 disposed in the fixation groove 1011, wherein the battery 105 is electrically connected to the circuit board assembly. In an example of this embodiment, the annular body 101 may be provided with one fixation groove 1011 on each of two sides of the mounting groove, and one or a group of batteries 105 are installed in each fixation groove 1011. The batteries 105 in the two fixation grooves 1011 may both be connected to the bottom plate 103 of the circuit board assembly, and may supply power to the bottom plate 103.

In some exemplary embodiments, as shown in FIG. 14, the display 1 further includes a bottom cover bracket 106 disposed on the annular body 101 and covering the mounting groove, a charging motherboard 107 and a bottom cover 108 disposed on the bottom cover bracket 106, wherein the circuit board assembly and the battery 105 (shown in FIG. 13) are both electrically connected to the charging motherboard 107, and the charging motherboard 107 is provided with the charging port 1071, the bottom cover 108 is disposed on an outer side of the charging motherboard 107 and exposes the charging port 1071.

In an example of this embodiment, as shown in FIG. 13 and FIG. 14, the bottom cover bracket 106 may be fixed on the annular body 101 by screws, and the bottom cover bracket 106 may be provided with a fixation arm 1061, which is pressed against the battery 105 (shown in FIG. 13), so that the battery 105 may be more firmly fixed in the fixation groove 1011. The charging motherboard 107 may be fixed on a side of the bottom cover bracket 106 facing away from the mounting groove by screws. The bottom plate 103 of the circuit board assembly and the battery 105 are both electrically connected to the charging motherboard 107. When the charging base 2 is connected to an external power source for charging the display 1, the battery 105 may be charged through the charging motherboard 107, and the battery 105 may be fully charged to supply power to the bottom plate 103 through the charging motherboard 107. When the charging base 2 is separated from the display 1, the battery 105 may supply power to the bottom plate 103, and the bottom plate 103 supplies power to the two flexible screens 102 and the core board 104.

Figure 16:
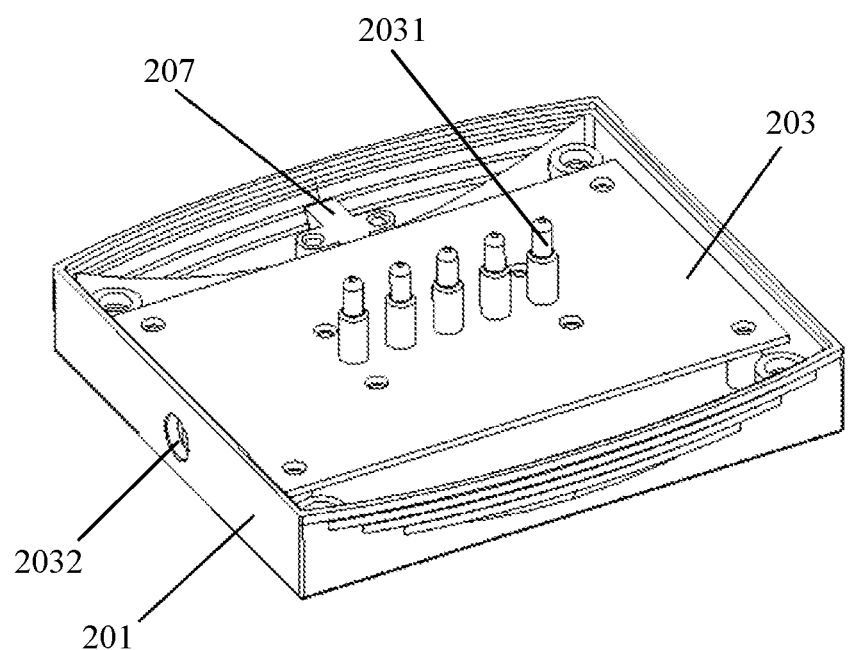
FIG. 16 is a schematic diagram of a structure of the charging base of FIG. 8 when an upper cover is not assembled.

In some exemplary embodiments, as shown in FIG. 8 and FIG. 16, the charging base 2 includes a base housing and a charging common board 203 disposed in the base housing. The charging common board 203 is provided with the power port 2032 and the charging connector 2031, and the charging connector 2031 extends out of the base housing and is configured to be inserted into and matched with the charging port 1071. In an example of this embodiment, the base housing includes a bottom housing 201 and an upper cover 202, wherein the charging connector 2031 extends out of the base housing from an opening at a corresponding position on the upper cover 202. There may be multiple charging connectors 2031, which are disposed in a one-to-one correspondence with multiple charging ports 1071 on the display 1.

Figure 9:
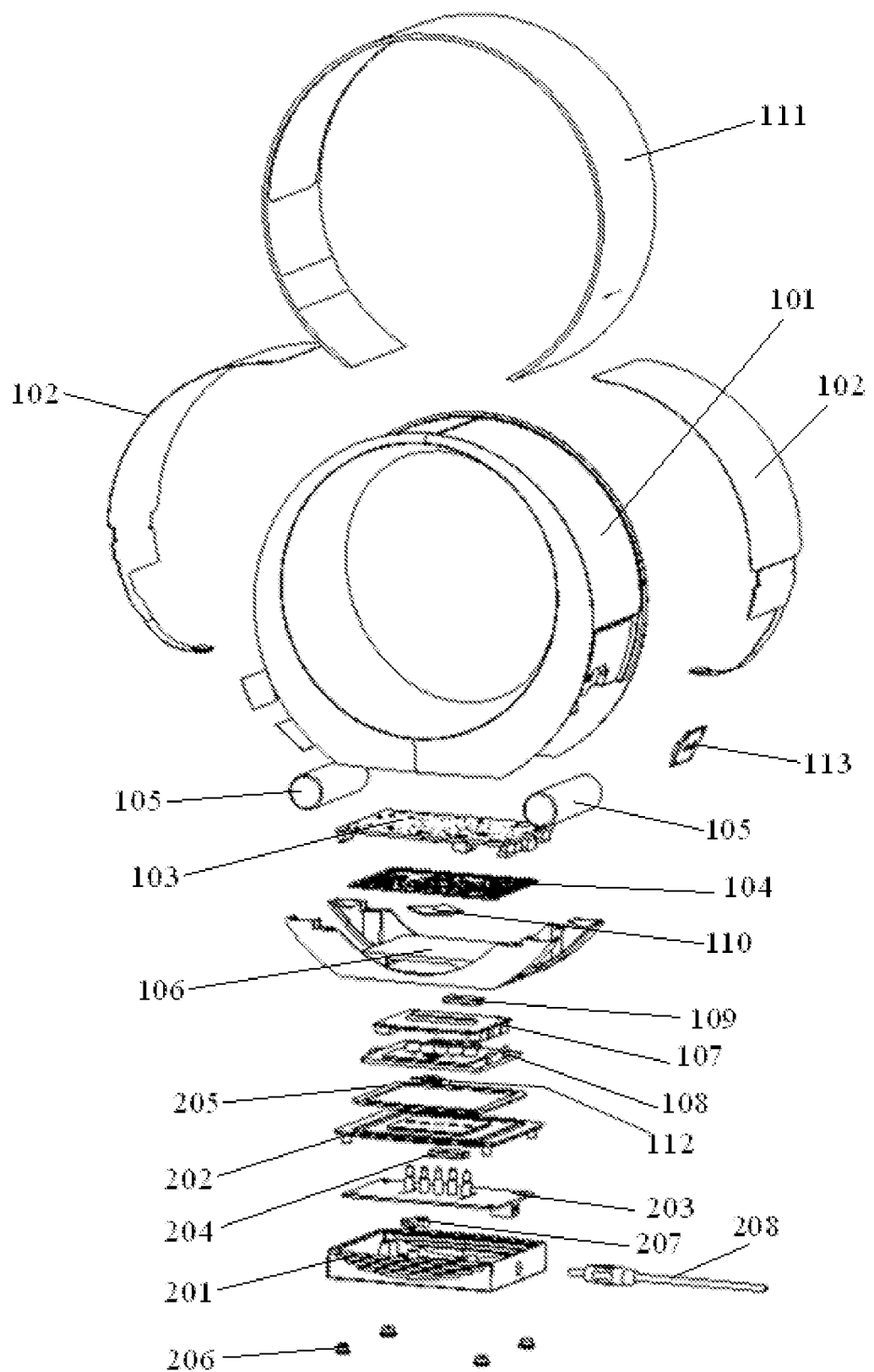
FIG. 9 is a schematic exploded structural view of the display device of FIG. 1.

In some exemplary embodiments, as shown in FIG. 8 and FIG. 9, the base housing includes a bottom housing 201 and an upper cover 202. An inner side of the upper cover 202 is provided with a first magnet 204, and an inner side of the bottom cover 108 is provided with a second magnet 109 corresponding to a position of the first magnet 204 and attracting each other. In an example of this embodiment, the inner side of the upper cover 202 is provided with a first groove to accommodate and fix the first magnet 204, and the inner side of the bottom cover 108 is provided with a second groove for accommodating and fixing the second magnet 109. The number of the first magnet 204 and the number of the second magnet 109 may be the same, and may both be one or more. With attraction of the first magnet 204 and the second magnet 109, the display 1 may be firmly placed on the charging base 2, and with automatic attraction of the first magnet 204 and the second magnet 109, the position of the charging port 1071 of the display 1 may be aligned with that of the charging connector 2031 on the charging base 2 when the display 1 is placed on the charging base 2, thus playing a role of positioning.

In some exemplary embodiments, as shown in FIGS. 8 and 9, a flexible grommet 205 may be disposed on an outer side of the upper cover 202, wherein the flexible grommet 205 may be disposed around the charging connector 2031. When the display 1 is placed on the charging base 2, the flexible grommet 205 may serve a buffer function to prevent the display 1 from coming into direct and hard contact with the charging base 2. The flexible grommet 205 may be bonded and fixed on the upper cover 202 by a double-sided tape or an adhesive. The upper cover 202 may be fixed on the bottom housing 201 by screws, the screws may penetrate into the upper cover 202 from a back side of the bottom housing 201, and flexible plugs 206 may be sleeved on the screws to cover the screws and beautify the appearance. In addition, the flexible plug 206 may also play a support and buffer role. The flexible grommet 205 and the flexible plugs 206 may be made of silica gel, rubber, etc.

In some exemplary embodiments, as shown in FIG. 16, a display lamp, such as an LED lamp, may also be disposed on a side of the charging common board 203 facing away from the upper cover 202. There is a gap between an edge of the charging common board 203 and a side edge of the bottom housing 201, a light guide post 207 may be disposed at the gap, wherein the light guide post 207 is configured to guide light emitted by the display lamp to the gap and diverge the light, so that the light emitted by the display lamp may be emitted through the upper cover 202 to illuminate the upper cover 202 of the charging base 2.

In some exemplary embodiments, as shown in FIGS. 2-7, the display 1 further includes a screen cover 111 disposed on the annular body 101 and covering outer sides of the two flexible screens 102, and two ends of the screen cover 111 are respectively located at two sides of the bottom cover 108. In an example of this embodiment, portions of the screen cover 111 corresponding to display regions of the two flexible screens 102 may be transparent so that pictures displayed by the two flexible screens 102 may be observed, and the screen cover 111 may play a role of protecting the flexible screens 102. The display 1 may further include a functional module disposed on an inner side of the screen cover 111 and electrically connected to the bottom plate 103, wherein the functional module may be a touch button 112, a WIFI antenna, a sensor board 113, etc. The functional module may be bonded to an inner side of the screen cover 111 near an end position by a double-sided tape.

In some exemplary embodiments, as shown in FIGS. 13 and 14, the core board 104 is provided with a heat conducting element 110 (shown in FIG. 9), wherein the heat conducting element 110 is in contact with the bottom cover bracket 106, and the bottom cover bracket 106 is made of a metal material. In an example of this embodiment, the heat conducting element 110 may be heat-dissipating silica gel and bonded to the core board 104, so as to conduct heat generated by some heating elements on the core board 104 to the bottom cover bracket 106 and dissipate the heat, thereby improving a heat dissipation capability.

Figure 15:
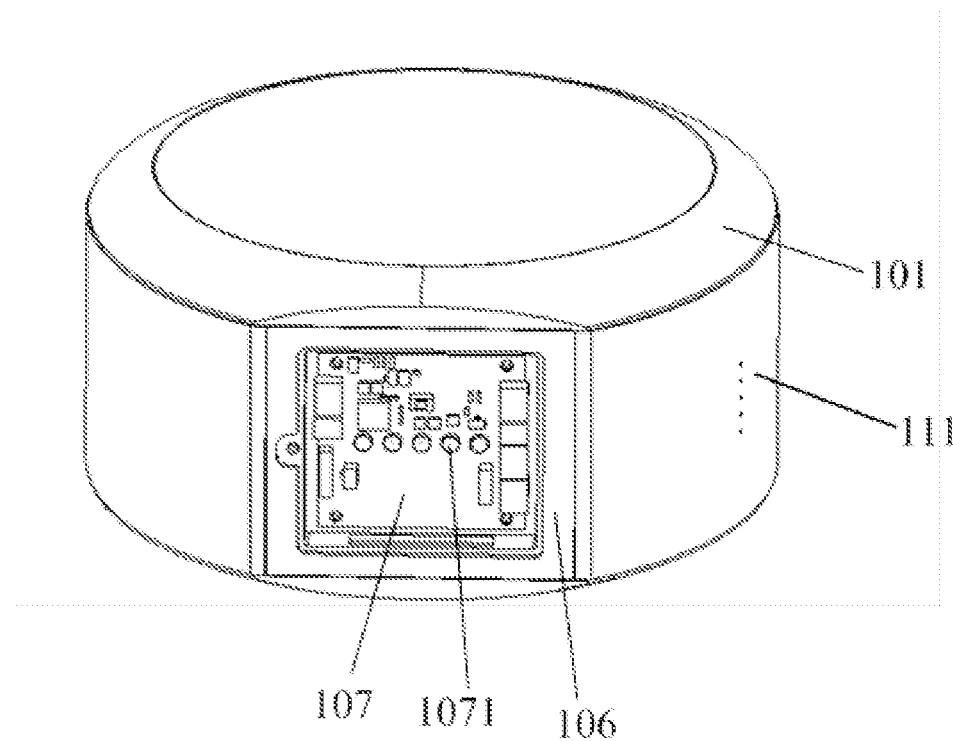
FIG. 15 is a schematic diagram of a structure of the display of FIG. 2 after a screen cover is assembled on the annular body.

In some exemplary embodiments, as shown in FIG. 9, an assembly process of the display device according to the embodiment of the present disclosure may be as follows: first, back sides (sides facing away from display sides) of the two flexible screens (OLED screens) 102 are bonded to heat dissipation films (SCF) and then bonded to the annular body 101, as shown in FIGS. 10 and 11. First ends of the two flexible screens 102 are spliced with each other and aligned with a positioning groove 1012 to prevent the two flexible screens 102 from deflection of attachment. An order of attaching is from the middle of the flexible screens 102 to two sides and extends to second ends of the flexible screens 102. The effect after the attaching is shown in FIG. 12. Then, the bottom plate 103 is fixed in the mounting groove of the annular body 101, and the heat conducting element 110 is bonded to the core board 104, the core board 104 is inserted into the slot provided on the bottom plate 103, the battery 105 is installed in the fixation groove 1011 provided on the annular body 101, and the flexible circuit boards at the second ends of the two flexible screens 102 are connected to the bottom plate 103, as shown in FIG. 13. Then, the bottom cover bracket 106 is fixed on the annular body 101 by screws, and the charging motherboard 107 is fixed on the bottom cover bracket 106, and both the battery 105 and the bottom plate 103 are electrically connected to the charging motherboard 107, as shown in FIG. 14. The touch button 112 and the WIFI antenna are wired to the bottom plate 103 and then bonded to an inner side at one end of the screen cover 111, and the sensor board 113 is wired to the bottom plate 103 and then bonded to an inner side at the other end of the screen cover 111 (measurement contacts on the sensor board 113 may be exposed through openings disposed at corresponding positions of the screen cover 111). Then, the screen cover 111 is bonded to and fixed on the annular body 101 and covers the outer sides of the two flexible screens 102, as shown in FIG. 15. After the second magnet 109 is bonded to and fixed on an inner side of the bottom cover 108, the bottom cover 108 is fixed on the bottom cover bracket 106 by screws, and the assembly of the display 1 is completed, as shown in FIG. 2. The charging common board 203 and the light guide post 207 are installed in the bottom housing 201, and the charging common board 203 is fixed on the bottom housing 201 by screws, as shown in FIG. 16. The first magnet 204 is bonded to and fixed on an inner side of the upper cover 202, the flexible grommet 205 is bonded to and fixed on an outer side of the upper cover 202, the upper cover 202 covers the bottom housing 201 and is fastened with screws, and flexible plugs 206 are sleeved on the screws to make them look better, thus completing the assembly of the charging base 2, as shown in FIG. 8. According to the display device of this embodiment, the display effect with double-sided splicing is achieved through reasonable structural designs and arrangements, an overall structural strength may be ensured, and the assembly is simple and easy to operate.

In the description of embodiments of the present disclosure, unless otherwise explicitly specified or defined, the terms "connect", "fixed connection", "install" and "assemble" are to be understood broadly, for example, a connection may be a fixed connection, or a detachable connection, or an be integral connection. The terms "install", "connect" and "fixed connection" may refer to a direct connection, or an indirect connection through an intermediate medium, or an internal connection between two elements. Those of ordinary skills in the art can understand the specific meanings of the above mentioned terms in the present disclosure according to specific context.

What is claimed is:

1. A display device, including a display, wherein the display comprises an annular body, two flexible screens and a circuit board assembly disposed on the annular body;
   the two flexible screens are attached on an outer surface of the annular body, and opposite first ends of the two flexible screens are spliced with each other;
   the circuit board assembly is disposed in a mounting groove provided on the annular body and positioned between second ends of the two flexible screens to be electrically connected to both of the two flexible screens and is capable of driving the two flexible screens to display independently; and
   wherein the annular body is further provided with a fixation groove located at a side of the mounting groove between the second ends of the two flexible screens;
   the display further comprises a battery disposed in the fixation groove, and the battery is electrically connected to the circuit board assembly.

2. The display device according to claim 1, wherein the annular body is further provided with a positioning mark, and the positioning mark is configured to play a role of alignment when the two flexible screens are fixed on the annular body.

3. The display device according to claim 2, wherein the positioning mark is a positioning groove or a marking line.

4. The display device according to claim 1, wherein the display is provided with a charging port;
   the display device further comprises a charging base, wherein the charging base is provided with a power port and a charging connector; the power port is configured to be connected to an external power source; and the charging connector is configured to be connected to the charging port when the display is placed on the charging base.

5. The display device according to claim 4, wherein the display further comprises a bottom cover bracket disposed on the annular body and covering the mounting groove, a charging motherboard and a bottom cover disposed on the bottom cover bracket;
   the circuit board assembly and the battery are electrically connected to the charging motherboard, the charging motherboard is provided with the charging port, and the bottom cover is disposed on an outer side of the charging motherboard and exposes the charging port.

6. The display device according to claim 5, wherein the bottom cover bracket is provided with a fixation arm, and the fixation arm is pressed against the battery.

7. The display device according to claim 6, wherein
when the charging base is connected to an eternal power source to charge the display, the battery is charged through the charging motherboard to supply power to the bottom plate through the charging motherboard after the battery is fully charged;
when the charging base is separated from the display, the battery supplies power to the bottom plate, and the bottom plate supplies power to the two flexible screens and the core board.

8. The display device according to claim 5, wherein the circuit board assembly comprises a bottom plate and a core board disposed on the bottom plate and electrically connected to the bottom plate;
the two flexible screens and the charging motherboard are all electrically connected to the bottom plate.

9. The display device according to claim 8, wherein the core board is provided with a heat conducting member, which is in contact with the bottom cover bracket, and the bottom cover bracket is made of a metal material.

10. The display device according to claim 5, wherein the charging base comprises a base housing and a charging common board disposed in the base housing, wherein the charging common board is provided with the power port and the charging connector, and the charging connector extends out of the base housing and is configured to be inserted into and matched with the charging port.

11. The display device according to claim 10, wherein the base housing comprises a bottom housing and an upper cover, an inner side of the upper cover is provided with a first magnet, and an inner side of the bottom cover is provided with a second magnet having a position corresponding to a position of the first magnet and attracting each other.

12. The display device of claim 11, wherein an outer side of the upper cover is provided with a flexible grommet, and the flexible grommet is disposed around the charging connector.

13. The display device according to claim 11, wherein a display lamp is further disposed on a side of the charging common board facing away from the upper cover.

14. The display device according to claim 11, wherein a gap is formed between an edge of the charging common board and a side edge of the bottom housing, and a light guide post is disposed at the gap.

15. The display device according to claim 5, wherein the display further comprises a screen cover disposed on the annular body and covering outer sides of the two flexible screens, and two ends of the screen cover are respectively positioned at two sides of the bottom cover.

16. The display device according to claim 15, wherein portions of the screen cover corresponding to display regions of the two flexible screens are transparent.

17. The display device according to claim 15, wherein the display further comprises a functional module disposed on an inner side of the screen cover and electrically connected to the circuit board assembly.

18. The display device according to claim 17, wherein the functional module comprises one or more of a touch button, a WIFI antenna and an environmental sensor.

19. A method for assembling the display device according to claim 1, and the method comprising:
attaching the two flexible screens on the outer surface of the annular body, and splicing the opposite first ends of the two flexible screens with each other;
disposing the circuit board assembly in the mounting groove provided on the annular body and positioned between the second ends of the two flexible screens; and
electrically connecting the circuit board assembly to the two flexible screens to drive the two flexible screens to display independently.

\* \* \* \* \*